(12) United States Patent
Tanaka et al.

(10) Patent No.: US 11,043,918 B2
(45) Date of Patent: Jun. 22, 2021

(54) POWER AMPLIFIER CIRCUIT

(71) Applicant: Murata Manufacturing Co., Ltd., Kyoto (JP)

(72) Inventors: Satoshi Tanaka, Kyoto (JP); Satoshi Arayashiki, Kyoto (JP); Satoshi Goto, Kyoto (JP); Yusuke Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/589,369

(22) Filed: Oct. 1, 2019

(65) Prior Publication Data

US 2020/0106391 A1 Apr. 2, 2020

(30) Foreign Application Priority Data

Oct. 2, 2018 (JP) .............................. JP2018-187387

(51) Int. Cl.
*H03F 1/02* (2006.01)
*H03F 3/21* (2006.01)
*H04W 88/02* (2009.01)

(52) U.S. Cl.
CPC ............. *H03F 1/0216* (2013.01); *H03F 3/21* (2013.01); *H03F 2200/451* (2013.01); *H04W 88/02* (2013.01)

(58) Field of Classification Search
CPC .................................................. H03F 1/0216
See application file for complete search history.

(56) References Cited

U.S. PATENT DOCUMENTS

| 6,690,231 | B1 | 2/2004 | Lee | |
|---|---|---|---|---|
| 7,256,646 | B2 * | 8/2007 | Eid | ........................... H03F 1/14 327/563 |
| 8,971,831 | B2 * | 3/2015 | Vidojkovic | .............. H04B 1/18 455/232.1 |
| 9,413,301 | B2 * | 8/2016 | Mattisson | ............... H03F 3/211 |
| 9,413,309 | B1 * | 8/2016 | Zhao | ....................... H03F 3/193 |
| 9,705,451 | B2 | 7/2017 | Takenaka et al. | |
| 10,020,780 | B2 | 7/2018 | Shimura | |
| 2012/0068769 | A1 | 3/2012 | Wang et al. | |

(Continued)

FOREIGN PATENT DOCUMENTS

JP 2004-32705 A 1/2004
JP 2005-12770 A 1/2005

(Continued)

*Primary Examiner* — Patricia T Nguyen
(74) *Attorney, Agent, or Firm* — Pearne & Gordon LLP (57) ABSTRACT

A power amplifier circuit includes a first transistor having an emitter electrically connected to a common potential, a base to which a first high-frequency signal is input, and a collector from which a third high-frequency signal is output; a second transistor having an emitter electrically connected to the common potential, a base to which a second high-frequency signal is input, and a collector from which a fourth high-frequency signal is output; a first capacitance circuit electrically connected between the collector of the second transistor and the base of the first transistor; and a second capacitance circuit electrically connected between the collector of the first transistor and the base of the second transistor.

15 Claims, 6 Drawing Sheets

(56) References Cited

U.S. PATENT DOCUMENTS

| | | | |
|---|---|---|---|
| 2015/0349721 A1* | 12/2015 | Samavedam | H03F 1/14 330/253 |
| 2016/0056769 A1 | 2/2016 | Takenaka et al. | |
| 2018/0076770 A1* | 3/2018 | Arfaei Malekzadeh | H03F 3/265 |
| 2018/0278219 A1* | 9/2018 | Abe | H03F 3/45179 |

FOREIGN PATENT DOCUMENTS

| | | |
|---|---|---|
| JP | 2005-124175 A | 5/2005 |
| JP | 2012-065168 A | 3/2012 |
| JP | 2017-139671 A | 8/2017 |
| WO | 2015/001851 A1 | 1/2015 |

\* cited by examiner

POWER AMPLIFIER CIRCUIT

This application claims priority from Japanese Patent Application No. JP2018-187387 filed on Oct. 2, 2018. The content of this application is incorporated herein by reference in its entirety.

BACKGROUND

The present disclosure relates to a power amplifier circuit. In a power amplifier circuit installed in a wireless communication terminal device, an improvement in power efficiency is necessary. As a system of improving power efficiency, there is an envelope tracking system in which a power-supply voltage of the power amplifier circuit is controlled in accordance with an amplitude level of an input signal.

International Publication No. 2015/001851 discloses a power amplification module employing an envelope tracking system.

At the present time, the second generation mobile communication system (for example, Global System for Mobile communications (GSM) (registered trademark)), the third generation mobile communication system (for example, Wideband Code Division Multiple Access (W-CDMA), Universal Mobile Telecommunications System (UMTS), and CDMA2000 1x), and the fourth generation mobile communication system (for example, Long Term Evolution (LTE), and LTE-Advanced) are used. Furthermore, the fifth generation mobile communication system (5G) is about to be put into practical use. In the fifth generation mobile communication system, examples of a frequency band of a high-frequency signal include a 3.5 GHz band ranging from about 3.3 GHz to about 4.2 GHz/from about 3.3 GHz to about 3.8 GHz, and a 4.5 GHz band ranging from about 4.5 GHz to about 4.99 GHz. When attention is paid to a band of a modulated signal, the band increases from about 1.25 MHz in W-CDMA, to about 20 MHz in LTE, to about 60 MHz in LTE-Advanced, and then to about 200 MHz in 5G. Hence, when a modulation bandwidth is increased, a speed on an envelope tracker side is not able to reach a signal speed of the modulation bandwidth. Thus, when discrete control is performed on the envelope tracker side, even if the modulation bandwidth is increased, it is possible to deal with up to the signal speed of the modulation bandwidth.

When a modulated signal band of a high-frequency signal is high as described above, it is difficult for a power supply circuit that performs envelope tracking by digital control to cause a power-supply voltage of the power amplifier circuit to track an envelope signal of a modulated signal. Because of this, for example, a system has been studied in which a stepped signal is generated with a period longer than that of the envelope signal.

The gain of a transistor in the power amplifier circuit has a power-supply voltage dependence. Hence, when a waveform of a power-supply voltage changes in a stepped manner, the gain of the power amplifier circuit changes in a stepped manner. Thus, when an envelope tracking power supply voltage changes in a stepped manner, the power amplifier circuit performs amplification to provide discrete gain levels, and amplification is therefore not able to be performed smoothly in an analog fashion.

BRIEF SUMMARY

In view of the above, the present disclosure has been made to enable a power amplifier circuit employing an envelope tracking system in which discrete voltages are output to perform continuous amplification.

A power amplifier circuit according to one aspect of the present disclosure is a power amplifier circuit that amplifies a first high-frequency differential signal including a first high-frequency signal of positive polarity and a second high-frequency signal of negative polarity and outputs a second high-frequency differential signal including a third high-frequency signal of negative polarity and a fourth high-frequency signal of positive polarity. The power amplifier circuit includes a first transistor having an emitter electrically connected to a common potential, a base to which the first high-frequency signal is input, and a collector from which the third high-frequency signal is output; a second transistor having an emitter electrically connected to the common potential, a base to which the second high-frequency signal is input, and a collector from which the fourth high-frequency signal is output; a first capacitance circuit electrically connected between the collector of the second transistor and the base of the first transistor; and a second capacitance circuit electrically connected between the collector of the first transistor and the base of the second transistor.

The present disclosure makes it possible to reduce a power-supply voltage dependence of gain and perform power amplification using digital envelope tracking.

Other features, elements, characteristics and advantages of the present disclosure will become more apparent from the following detailed description of embodiments of the present disclosure with reference to the attached drawings.

DETAILED DESCRIPTION

Embodiments of a power amplifier circuit according to the present disclosure will be described in detail below with reference to the drawings. Note that the present disclosure is not to be limited by these embodiments. Each embodiment is merely illustrative, and it goes without necessarily saying that configurations described in different embodiments can be partially replaced or combined. In second and subsequent embodiments, a description of things in common with a first embodiment is omitted, and only respects in which the second and subsequent embodiments differ from the first embodiment will be described. In particular, similar function effects achieved by similar configurations are not repeatedly described in each embodiment.

First Embodiment

Figure 1:
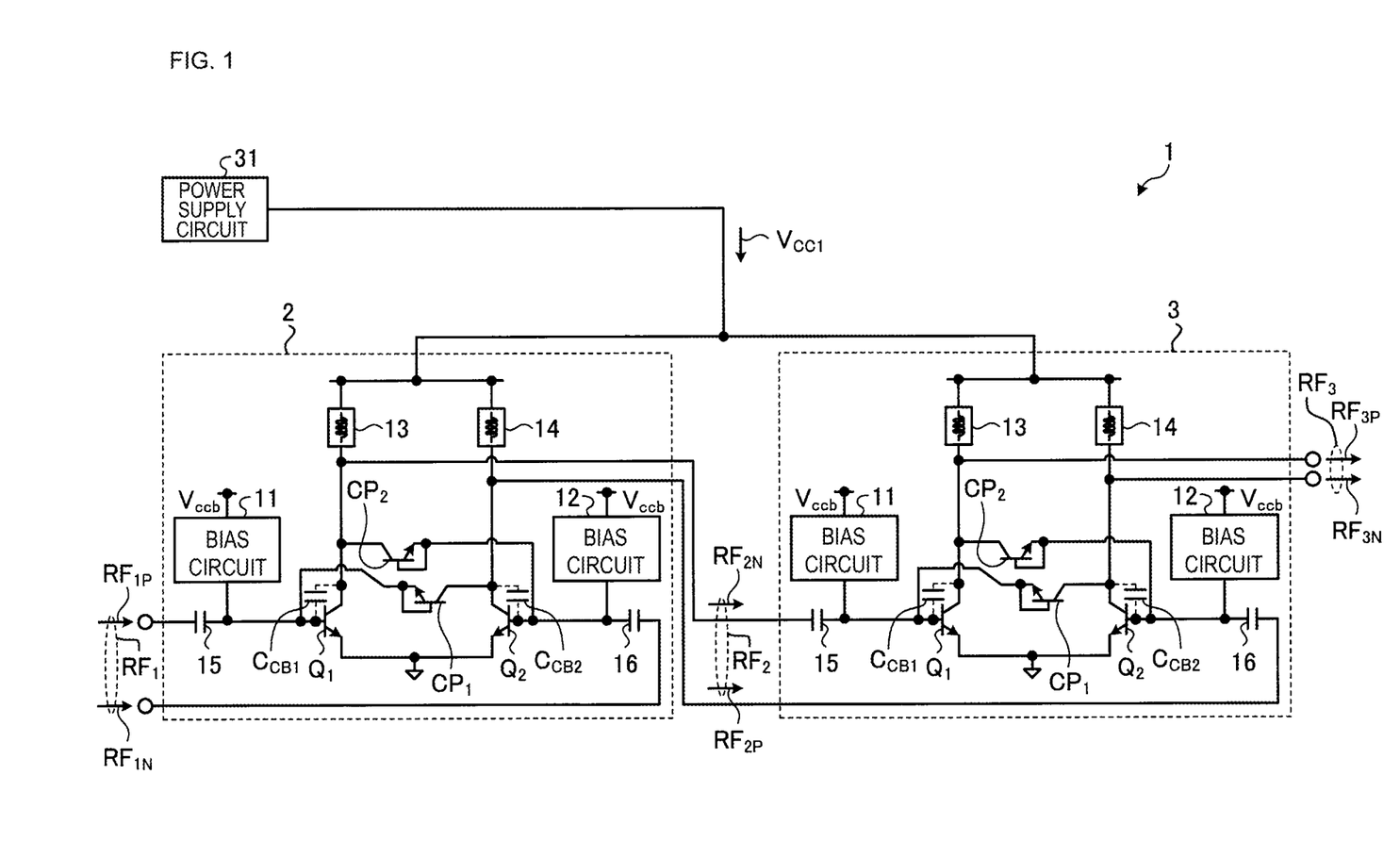
FIG. 1 illustrates a configuration of a power amplifier according to a first embodiment.

FIG. 1 illustrates a configuration of a power amplifier according to a first embodiment. A power amplifier 1 amplifies a high-frequency differential signal $RF_1$ of a radio frequency and outputs a high-frequency differential signal $RF_3$ of a radio frequency. The high-frequency differential signal $RF_1$ includes a high-frequency signal $RF_{1P}$ of positive polarity and a high-frequency signal $RF_{1N}$ of negative polarity. The high-frequency differential signal $RF_3$ includes a high-frequency signal $RF_{3P}$ of positive polarity and a high-frequency signal $RF_{3N}$ of negative polarity.

The high-frequency differential signal $RF_1$ corresponds to "first high-frequency differential signal" in the present disclosure. The high-frequency signal $RF_{1P}$ corresponds to "first high-frequency signal" in the present disclosure. The high-frequency signal $RF_{1N}$ corresponds to "second high-frequency signal" in the present disclosure.

The power amplifier 1 can be used in a mobile communication device, such as a cellular phone device, to transmit various signals, such as voice and data, to a base station. The power amplifier 1 may be formed on one semiconductor chip (die).

The power amplifier 1 includes a first-stage power amplifier circuit 2 and a second-stage power amplifier circuit 3. In the first embodiment, although the number of power amplifier circuit stages is two, the present disclosure is not limited to this. The number of power amplifier circuit stages may be one or three or more.

The power amplifier circuit 2 amplifies the high-frequency differential signal $RF_1$. Subsequently, the power amplifier circuit 2 outputs a high-frequency differential signal $RF_2$ that has been amplified to the power amplifier circuit 3. The high-frequency differential signal $RF_2$ includes a high-frequency signal $RF_{2P}$ of positive polarity and a high-frequency signal $RF_{2N}$ of negative polarity. The power amplifier circuit 3 amplifies the high-frequency differential signal $RF_2$. Subsequently, the power amplifier circuit 3 outputs the high-frequency differential signal $RF_3$ that has been amplified.

The high-frequency differential signal $RF_2$ corresponds to "second high-frequency differential signal" in the present disclosure. The high-frequency signal $RF_{2N}$ corresponds to "third high-frequency signal" in the present disclosure. The high-frequency signal $RF_{2P}$ corresponds to "fourth high-frequency signal" in the present disclosure.

Although frequencies of the high-frequency differential signal $RF_1$, the high-frequency differential signal $RF_2$, and the high-frequency differential signal $RF_3$ range, for example, from about several hundred megahertz (MHz) to about several tens of gigahertz (GHz), the present disclosure is not limited to this.

A configuration of the power amplifier circuit 2 will be described below. A configuration of the power amplifier circuit 3 is similar to that of the power amplifier circuit 2, and a description thereof is therefore omitted.

The power amplifier circuit 2 is a differential amplifier circuit. The power amplifier circuit 2 includes transistors $Q_1$ and $Q_2$.

The transistor $Q_1$ corresponds to "first transistor" in the present disclosure. The transistor $Q_2$ corresponds to "second transistor" in the present disclosure.

In the first embodiment, although each of the transistors $Q_1$ and $Q_2$ is, for example, a heterojunction bipolar transistor (HBT), the present disclosure is not limited to this. Each of the transistors $Q_1$ and $Q_2$ may be, for example, a field-effect transistor (FET). Each of the transistors $Q_1$ and $Q_2$ may be a multi-finger transistor including a plurality of unit transistors (also referred to as fingers) electrically connected in parallel. A unit transistor refers to a minimum component constituting a transistor.

An emitter of the transistor $Q_1$ and an emitter of the transistor $Q_2$ are electrically connected to a reference potential. Although the reference potential is, for example, a ground potential, the present disclosure is not limited to this.

The transistor $Q_1$ has a collector-base capacitance $C_{CB1}$. The collector-base capacitance $C_{CB1}$ is a junction capacitance between a collector (N-type semiconductor) and a base (P-type semiconductor). Similarly, the transistor $Q_2$ has a collector-base capacitance $C_{CB2}$.

The power amplifier circuit 2 includes bias circuits 11 and 12. The bias circuit 11 receives a supply of a power-supply potential $V_{ccb}$ and outputs a fixed bias potential (bias current) to the base of the transistor $Q_1$. The bias circuit 12 receives a supply of the power-supply potential $V_{ccb}$ and outputs a fixed bias potential (bias current) to a base of the transistor $Q_2$.

The power amplifier circuit 2 includes choke inductors 13 and 14. The collector of the transistor $Q_1$ is electrically connected to a power supply circuit 31 through the choke inductor 13. A collector of the transistor $Q_2$ is electrically connected to the power supply circuit 31 through the choke inductor 14.

The choke inductors 13 and 14 serve a function of blocking passage of alternating-current power. The choke inductors 13 and 14 have sufficiently high impedances for frequency bands of the high-frequency differential signal $RF_1$ and the high-frequency differential signal $RF_2$. That is, when the frequency bands of the high-frequency differential signal $RF_1$ and the high-frequency differential signal $RF_2$ are considered, the impedances of the choke inductors 13 and 14 are negligible. Furthermore, the choke inductors 13 and 14 inhibit leakage of the high-frequency differential signal $RF_1$ and the high-frequency differential signal $RF_2$ to the power supply circuit 31.

The power supply circuit 31 outputs a power-supply potential $V_{CC1}$ based on an amplitude level of the high-frequency differential signal $RF_1$ to the collector of the transistor $Q_1$ through the choke inductor 13 and also to the collector of the transistor $Q_2$ through the choke inductor 14.

That is, the power supply circuit 31 is an envelope tracker that performs envelope tracking control for improving power efficiency by controlling the power-supply potential $V_{CC1}$ of the power amplifier circuit 2 in accordance with the amplitude level of the high-frequency differential signal $RF_1$.

The power amplifier circuit 2 includes coupling capacitors 15 and 16. One end of the coupling capacitor 15 is electrically connected to the base of the transistor $Q_1$. The high-frequency signal $RF_{1P}$ of positive polarity is input to the base of the transistor $Q_1$ through the coupling capacitor 15. One end of the coupling capacitor 16 is electrically connected to the base of the transistor $Q_2$. The high-frequency signal $RF_{1N}$ of negative polarity is input to the base of the transistor $Q_2$ through the coupling capacitor 16.

Each of the transistors Q1 and Q2 operates as a common-emitter circuit in which the collector serves as an output. Hence, the transistor $Q_1$ outputs, from the collector, the high-frequency signal $RF_{2N}$ of negative polarity obtained by inverting amplification of the high-frequency signal $RF_{1P}$ of positive polarity. Furthermore, the transistor $Q_2$ outputs, from the collector, the high-frequency signal $RF_{2P}$ of positive polarity obtained by inverting amplification of the high-frequency signal $RF_{1N}$ of negative polarity.

Since the power amplifier circuit 2 is a differential amplifier circuit, the present disclosure is not limited to the size (the number of fingers) of the transistor $Q_1$ as equal to the size (the number of fingers) of the transistor $Q_2$.

The power amplifier circuit 2 further includes transistors $CP_1$ and $CP_2$.

A collector of the transistor $CP_1$ is electrically connected to the collector of the transistor $Q_2$. A base of the transistor $CP_1$ is electrically connected to the base of the transistor $Q_1$.

In the first embodiment, although an emitter of the transistor $CP_1$ is electrically connected to the base of the transistor $CP_1$ (the base of the transistor $Q_1$), the present disclosure is not limited to this. The emitter of the transistor $CP_1$ may be open (floating) without necessarily being connected anywhere. Note that, when the emitter of the transistor $CP_1$ is electrically connected to the base of the transistor $CP_1$, the potential of the emitter of the transistor $CP_1$ is stabilized, noise immunity is enhanced, and noise can be reduced.

A collector of the transistor $CP_2$ is electrically connected to the collector of the transistor $Q_1$. A base of the transistor $CP_2$ is electrically connected to the base of the transistor $Q_2$.

In the first embodiment, although an emitter of the transistor $CP_2$ is electrically connected to the base of the transistor $CP_2$ (the base of the transistor $Q_2$), the present disclosure is not limited to this. The emitter of the transistor $CP_2$ may be open (floating) without necessarily being connected anywhere. Note that, when the emitter of the transistor $CP_2$ is electrically connected to the base of the transistor $CP_2$, the potential of the emitter of the transistor $CP_2$ is stabilized, noise immunity is enhanced, and noise can be reduced.

That is, the transistor $CP_1$ and the transistor $CP_2$ respectively provide cross-coupling between the base of the transistor $Q_1$ and the collector of the transistor $Q_2$ and cross-coupling between the base of the transistor $Q_2$ and the collector of the transistor $Q_1$.

The transistor $CP_1$ corresponds to "third transistor" and "first capacitance circuit" in the present disclosure. When a base potential of the transistor $Q_1$ is equal to a base potential of the transistor $Q_2$, a collector-base capacitance value of the transistor $CP_1$ is often set at roughly the same value as the collector-base capacitance $C_{CB2}$. The transistor $CP_2$ corresponds to "fourth transistor" and "second capacitance circuit" in the present disclosure. When the base potential of the transistor $Q_1$ is equal to the base potential of the transistor $Q_2$, a collector-base capacitance value of the transistor $CP_2$ is often set at roughly the same value as the collector-base capacitance $C_{CB1}$.

Prior to description of actions of the transistors $CP_1$ and $CP_2$, a comparative example will be described. As an example of a comparative example, the case where the power amplifier circuits 2 and 3 do not include the transistors $CP_1$ and $CP_2$ is assumed.

Figure 2:
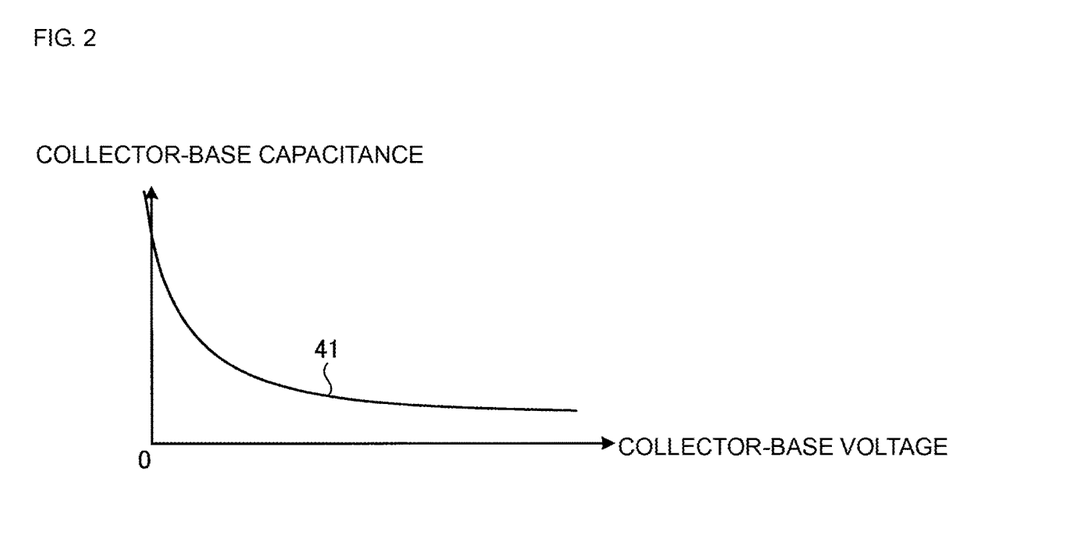
FIG. 2 illustrates a relationship between a collector-base voltage and a collector-base capacitance in a transistor.

FIG. 2 illustrates a relationship between a collector-base voltage and a collector-base capacitance in a transistor. As represented by a waveform 41 in FIG. 2, the collector-base capacitance of the transistor changes nonlinearly so that the collector-base capacitance decreases as the collector-base voltage increases and so that the collector-base capacitance increases as the collector-base voltage decreases.

An output signal output from a collector is fed back to a base through the collector-base capacitance. Here, a common-emitter circuit is an inverting amplifier circuit. That is, the polarity of a voltage of an output signal output from the collector is inverted from the polarity of a voltage of an input signal input to the base. Hence, the collector-base capacitance has a negative feedback action and has an action of reducing gain. The strength of negative feedback (the degree of reduction in gain) increases as the collector-base capacitance increases (the collector-base voltage decreases), and the strength of negative feedback decreases as the collector-base capacitance decreases (the collector-base voltage increases). That is, the gain of a power amplifier circuit has a strong power-supply voltage dependence.

Figure 3:
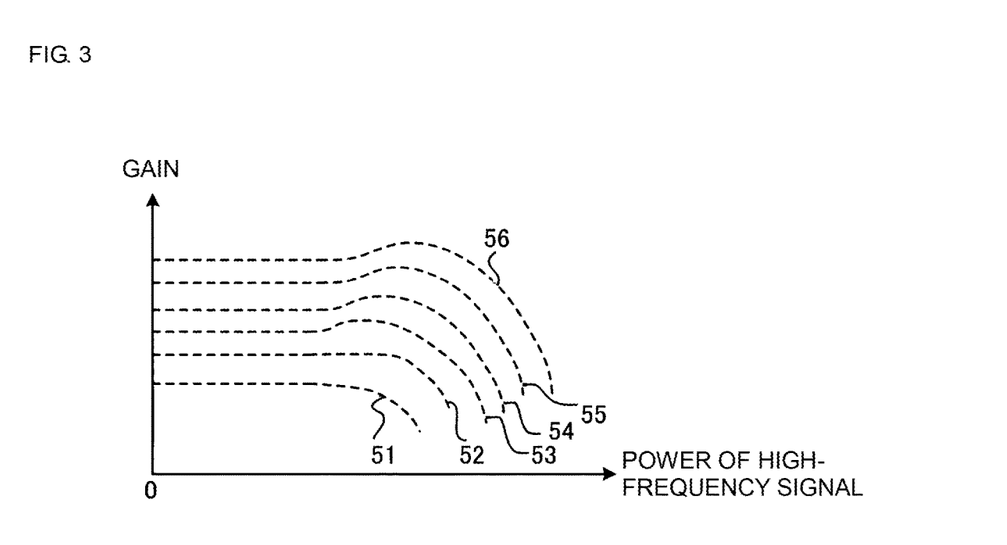
FIG. 3 illustrates a relationship between power of a high-frequency signal and gain in a power amplifier circuit in a comparative example.

FIG. 3 illustrates a relationship between power of a high-frequency signal and gain in a power amplifier circuit in the comparative example. A waveform 51 represents, in the case where a collector-base voltage is a first voltage $V_1$, a relationship between power of the high-frequency signal and gain. A waveform 52 represents, in the case where the collector-base voltage is a second voltage $V_2$ ($V_1 < V_2$), a relationship between power of the high-frequency signal and gain. A waveform 53 represents, in the case where the collector-base voltage is a third voltage $V_3$ ($V_2 < V_3$), a relationship between power of the high-frequency signal and gain. A waveform 54 represents, in the case where the collector-base voltage is a fourth voltage $V_4$ ($V_3 < V_4$), a relationship between power of the high-frequency signal and gain. A waveform 55 represents, in the case where the collector-base voltage is a fifth voltage $V_5$ ($V_4 < V_5$), a relationship between power of the high-frequency signal and gain. A waveform 56 represents, in the case where the collector-base voltage is a sixth voltage $V_6$ ($V_5 < V_6$), a relationship between power of the high-frequency signal and gain.

As described above, the strength of negative feedback (the degree of reduction in gain) increases as the collector-base capacitance increases (the collector-base voltage decreases), and the strength of negative feedback decreases as the collector-base capacitance decreases (the collector-base voltage increases). Hence, as illustrated in FIG. 3, the gain decreases as the collector-base voltage decreases, and the gain increases as the collector-base voltage increases.

Figure 4:
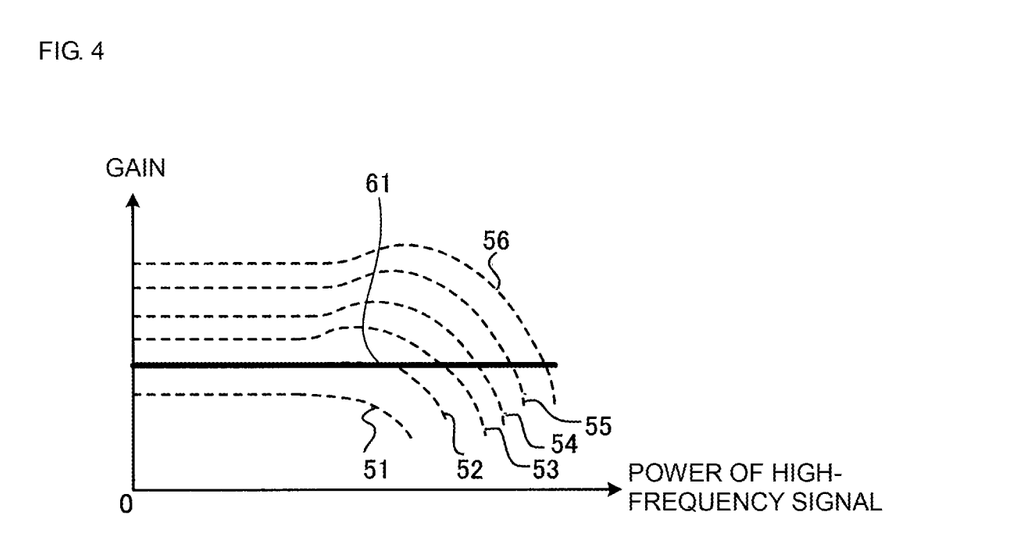
FIG. 4 illustrates a relationship between power of a high-frequency signal and gain in the power amplifier circuit in the comparative example.

FIG. 4 illustrates a relationship between power of a high-frequency signal and gain in the power amplifier circuit in the comparative example. If the power supply circuit 31, which is an envelope tracker, can change the collector-base voltage from $V_2$ to $V_6$ smoothly (continuously, in an analog fashion), the gain of the power amplifier circuit can be made constant as represented by a waveform 61.

However, when a modulated signal band of the high-frequency signal is high, the power supply circuit 31 is not able to control a power-supply voltage of the power amplifier circuit smoothly. That is, a waveform of the power-supply voltage changes in a stepped manner (discretely).

Figure 5:
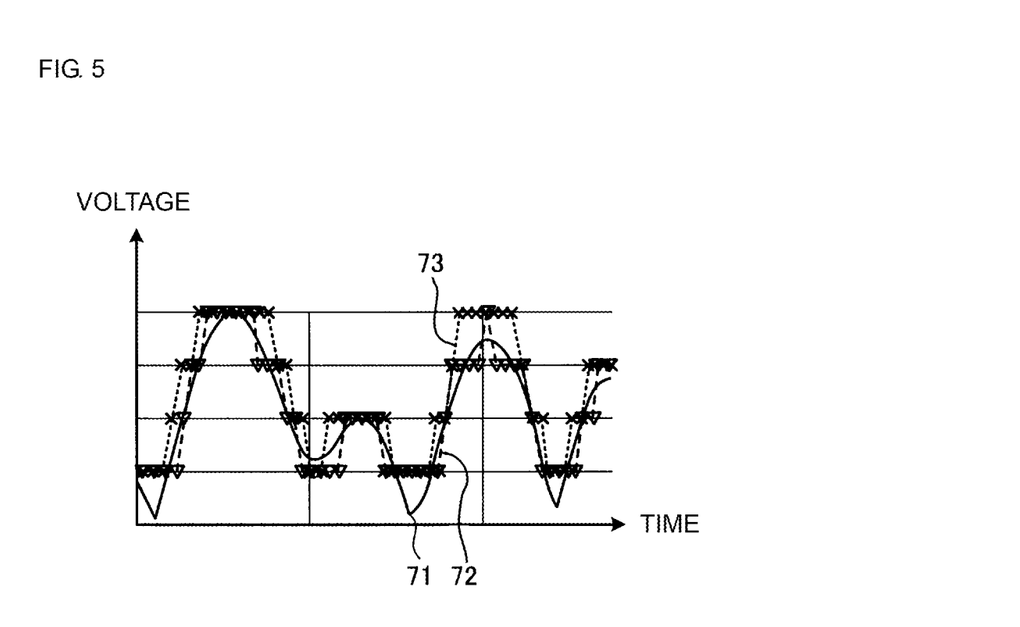
FIG. 5 illustrates an example of a power-supply voltage.

FIG. 5 illustrates an example of a power-supply voltage. A waveform 71 represents a high-frequency signal. A waveform 72 represents an example of a power-supply voltage. A waveform 73 represents another example of a power-supply voltage.

When a modulated signal band of the high-frequency signal is high, the power supply circuit 31 that performs envelope tracking by digital control is not able to control a power-supply voltage of the power amplifier circuit smoothly. That is, as represented by the waveform 72 or 73, the waveform of the power-supply voltage changes in a stepped manner (discretely).

When the power-supply voltage dependence of gain is strong, a harmonic component (high-frequency component) included in the waveform 72 or 73 is modulated into a band of the high-frequency signal and superimposed on a high-frequency output signal.

Figure 6:
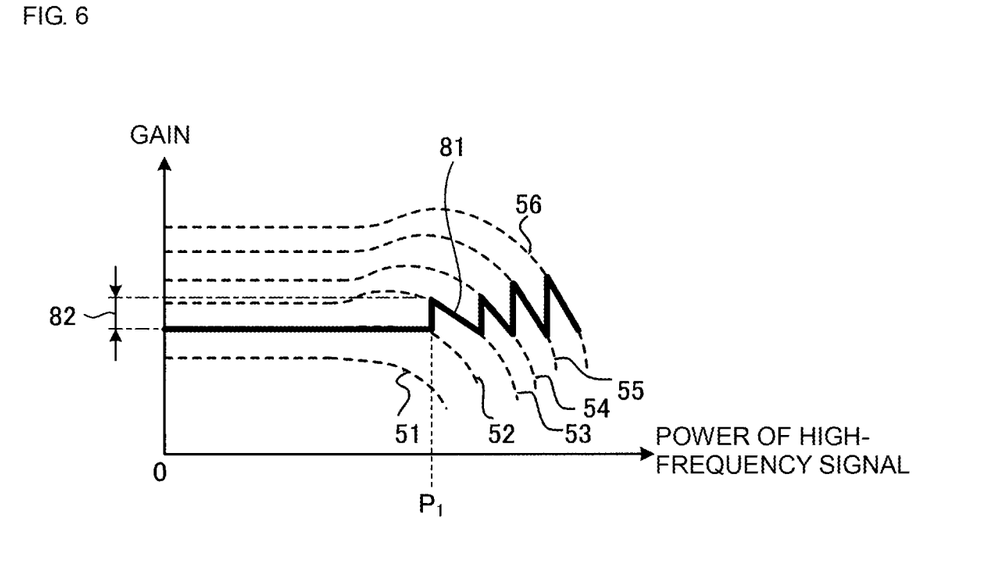
FIG. 6 illustrates a relationship between power of a high-frequency signal and gain in the power amplifier circuit in the comparative example.

FIG. 6 illustrates a relationship between power of a high-frequency signal and gain in the power amplifier circuit in the comparative example. When the power supply circuit 31 changes the collector-base voltage from $V_2$, to $V_3$, to $V_4$, to $V_5$, and then to $V_6$ in a stepped manner (discretely), the gain of the power amplifier circuit varies greatly as represented by a waveform 81. For example, when the power supply circuit 31 changes the collector-base voltage from $V_2$ to $V_3$ when power of the high-frequency signal is $P_1$, the amount of change in the gain of the power amplifier circuit is large as represented by an arrow 82. That is, the power amplifier circuit is not able to perform linear amplification.

Here, referring back to FIG. 1, the power amplifier circuit 2 according to the first embodiment includes the transistors $CP_1$ and $CP_2$.

The collector of the transistor $CP_1$ is electrically connected to the collector of the transistor $Q_2$, and the base of the transistor $CP_1$ is electrically connected to the base of the transistor $Q_1$. Hence, the high-frequency signal $RF_{2P}$ is fed back to the base of the transistor $Q_1$ through a collector-base capacitance of the transistor $CP_1$. Here, the polarity of a voltage of the high-frequency signal $RF_{2P}$ output from the collector of the transistor $Q_2$ is the same as the polarity of a voltage of the high-frequency signal $RF_{1P}$ input to the base of the transistor $Q_1$. Thus, the collector-base capacitance of the transistor $CP_1$ has a positive feedback action and has an action of increasing the gain of the transistor $Q_1$.

The collector-base capacitance of the transistor $CP_1$ can be substantially equal to the collector-base capacitance $C_{CB1}$ of the transistor $Q_1$. That is, the size (the number of fingers) of the transistor $CP_1$ can be equal to the size (the number of fingers) of the transistor $Q_1$. Thus, the amount of increase in voltage due to the positive feedback action of the collector-base capacitance of the transistor $CP_1$ is substantially equal to the amount of decrease in voltage due to the negative feedback action of the collector-base capacitance $C_{CB1}$ of the transistor $Q_1$. Note that the present disclosure is not limited to this.

Similarly, the collector of the transistor $CP_2$ is electrically connected to the collector of the transistor $Q_1$, and the base of the transistor $CP_2$ is electrically connected to the base of the transistor $Q_2$. Hence, the high-frequency signal $RF_{2N}$ is fed back to the base of the transistor $Q_2$ through a collector-base capacitance of the transistor $CP_2$. Here, the polarity of a voltage of the high-frequency signal $RF_{2N}$ output from the collector of the transistor $Q_1$ is the same as the polarity of a voltage of the high-frequency signal $RF_{1N}$ input to the base of the transistor $Q_2$. Thus, the collector-base capacitance of the transistor $CP_2$ has a positive feedback action and has an action of increasing the gain of the transistor $Q_2$.

The collector-base capacitance of the transistor $CP_2$ can be substantially equal to the collector-base capacitance $C_{CB2}$ of the transistor $Q_2$. That is, the size (the number of fingers) of the transistor $CP_2$ can be equal to the size (the number of fingers) of the transistor $Q_2$. Thus, the amount of increase in voltage due to the positive feedback action of the collector-base capacitance of the transistor $CP_2$ is substantially equal to the amount of decrease in voltage due to the negative feedback action of the collector-base capacitance $C_{CB2}$ of the transistor $Q_2$. Note that the present disclosure is not limited to this.

For example, in the case where the voltage amplitudes of the high-frequency differential signals $RF_1$ and $RF_2$ are small, the collector-base capacitance $C_{CB1}$ of the transistor $Q_1$ is substantially equal to the collector-base capacitance of the transistor $CP_1$. Additionally, a collector potential of the transistor $Q_1$ is substantially equal to a collector potential of the transistor $Q_2$. Furthermore, the base potential of the transistor $Q_1$ is substantially equal to the base potential of the transistor $Q_2$. Hence, the amount of decrease in voltage due to the negative feedback action of the collector-base capacitance $C_{CB1}$ of the transistor $Q_1$ is substantially equal to the amount of increase in voltage due to the positive feedback action of the collector-base capacitance of the transistor $CP_1$. Thus, the amount of decrease in voltage due to the negative feedback action of the collector-base capacitance $C_{CB1}$ of the transistor $Q_1$ is compensated for by the amount of increase in voltage due to the positive feedback action of the collector-base capacitance of the transistor $CP_1$.

Figure 7:
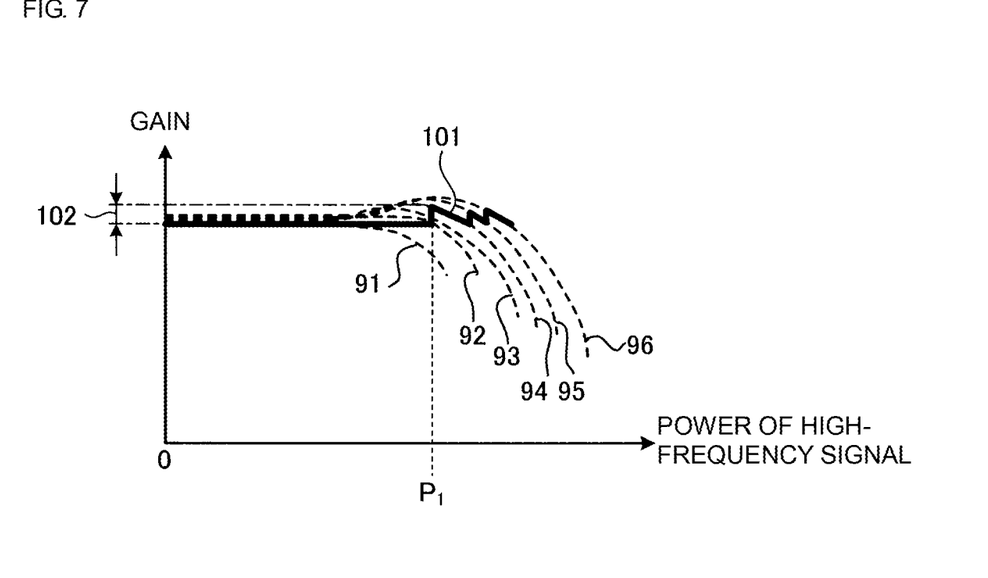
FIG. 7 illustrates a relationship between power of a high-frequency signal and gain in a power amplifier circuit according to the first embodiment.

FIG. 7 illustrates a relationship between power of a high-frequency signal and gain in a power amplifier circuit according to the first embodiment. A waveform 91 represents, in the case where collector-base voltages of the transistors $Q_1$ and $Q_2$ are the first voltage $V_1$, a relationship between power of the high-frequency signal and gain. A waveform 92 represents, in the case where the collector-base voltages of the transistors $Q_1$ and $Q_2$ are the second voltage $V_2$, a relationship between power of the high-frequency signal and gain. A waveform 93 represents, in the case where the collector-base voltages of the transistors $Q_1$ and $Q_2$ are the third voltage $V_3$, a relationship between power of the high-frequency signal and gain. A waveform 94 represents, in the case where the collector-base voltages of the transistors $Q_1$ and $Q_2$ are the fourth voltage $V_4$, a relationship between power of the high-frequency signal and gain. A waveform 95 represents, in the case where the collector-base voltages of the transistors $Q_1$ and $Q_2$ are the fifth voltage $V_5$, a relationship between power of the high-frequency signal and gain. A waveform 96 represents, in the case where the collector-base voltages of the transistors $Q_1$ and $Q_2$ are the sixth voltage $V_6$, a relationship between power of the high-frequency signal and gain.

In the power amplifier circuit 2, the amount of decrease in voltage due to the negative feedback action of the collector-base capacitance $C_{CB1}$ of the transistor $Q_1$ is compensated for by the amount of increase in voltage due to the positive feedback action of the collector-base capacitance of the transistor $CP_1$. Similarly, the amount of decrease in voltage due to the negative feedback action of the collector-base capacitance $C_{CB2}$ of the transistor $Q_2$ is compensated for by the amount of increase in voltage due to the positive feedback action of the collector-base capacitance of the transistor $CP_2$. Hence, in the power amplifier circuit 2, even when the collector-base voltages of the transistors $Q_1$ and $Q_2$ change, a reduction in gain is inhibited. That is, the gain of the power amplifier circuit has a weak power-supply voltage dependence.

In the power amplifier circuit 2, the power-supply voltage dependence of gain is weak. Hence, the power amplifier circuit 2 can prevent a harmonic component (high-frequency component) of a power-supply voltage (see the waveform 72 or 73 in FIG. 5) from modulating into a band of a high-frequency signal. Therefore, the output of the high-frequency component can be prevented from superimposing on the high-frequency wave of a power-supply voltage.

Furthermore, even when the power supply circuit 31 changes the collector-base voltages from $V_2$, to $V_3$, to $V_4$, to $V_5$, and then to $V_6$ in a stepped manner (discretely), the power amplifier circuit 2 can reduce variations in gain as represented by a waveform 101. For example, even when the power supply circuit 31 changes the collector-base voltages from $V_2$ to $V_4$ when power of the high-frequency signal is $P_1$, the amount of change in the gain of the power amplifier circuit is reduced in comparison with that represented by the arrow 82 (see FIG. 6) as represented by an arrow 102. Thus, the power amplifier circuit 2 can reduce nonlinearity and increase linearity.

As described above, the power amplifier circuit 2 includes the transistors $CP_1$ and $CP_2$ and thereby can weaken the power-supply voltage dependence of gain.

Thus, the power amplifier circuit 2 can prevent a harmonic wave of a power-supply voltage (see the waveform 72 or 73 in FIG. 5) from modulating into a band of a high-frequency signal. Therefore, the output of the high-frequency component can be prevented from superimposing on the high-frequency signal of a power-supply voltage.

Furthermore, even when the power supply circuit 31 changes the collector-base voltages in a stepped manner (discretely), the power amplifier circuit 2 can reduce variations in gain. Thus, the power amplifier circuit 2 can reduce nonlinearity and increase linearity.

As a result, the power amplifier circuit 2 can perform envelope tracking.

Second Embodiment

Figure 8:
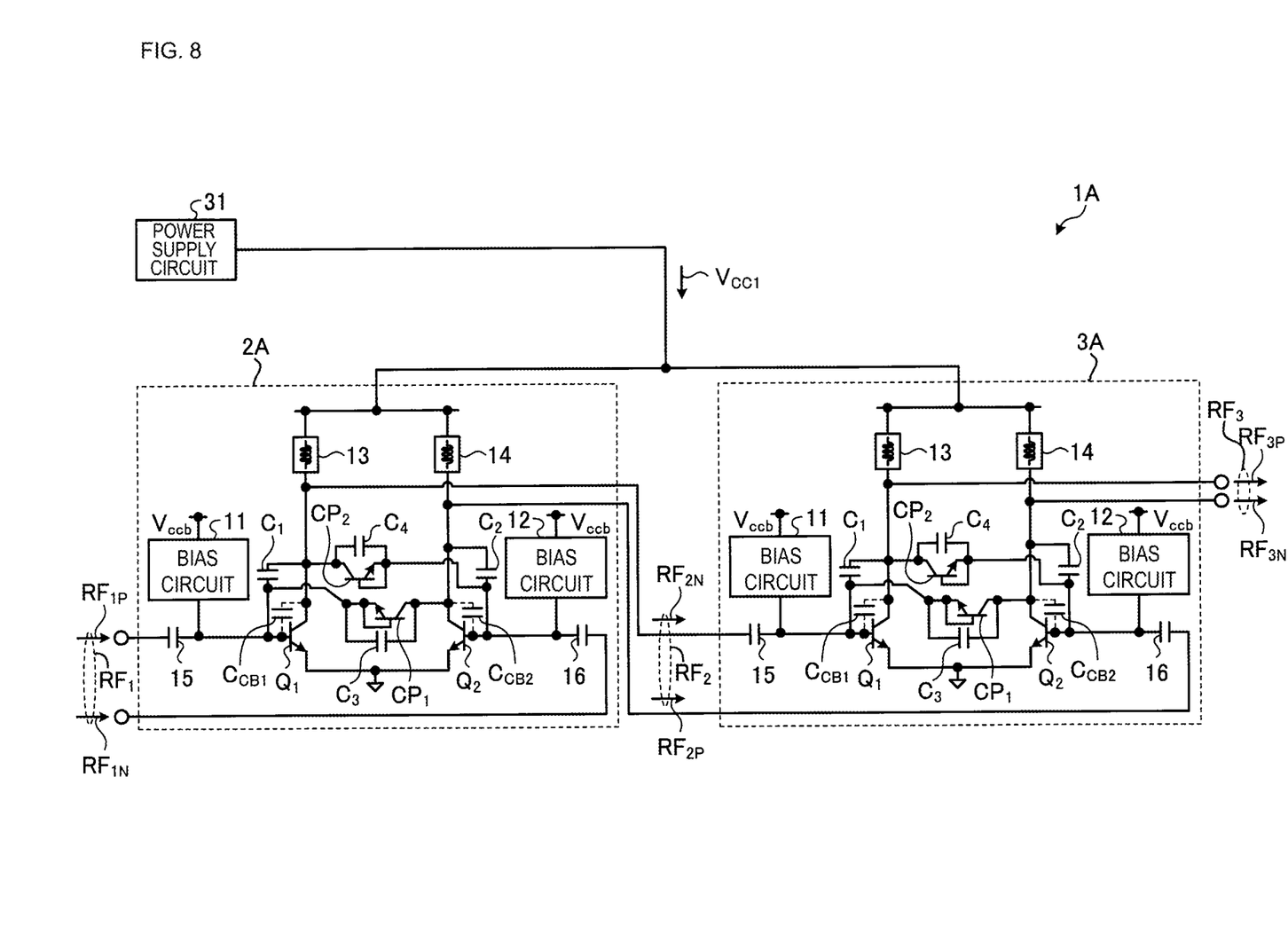
FIG. 8 illustrates a configuration of a power amplifier according to a second embodiment.

FIG. 8 illustrates a configuration of a power amplifier according to a second embodiment. A power amplifier 1A includes power amplifier circuits 2A and 3A. In comparison with the power amplifier circuit 2, the power amplifier circuit 2A further includes capacitors $C_1$, $C_2$, $C_3$, and $C_4$. A circuit configuration of the power amplifier circuit 3A is similar to a circuit configuration of the power amplifier circuit 2A, and a description thereof is therefore omitted.

The capacitor $C_1$ corresponds to "first capacitor" in the present disclosure. The capacitor $C_2$ corresponds to "second capacitor" in the present disclosure.

The capacitor $C_3$ corresponds to "third capacitor" in the present disclosure. A parallel-connected circuit including the transistor $CP_1$ and the capacitor $C_3$ corresponds to "first capacitance circuit" in the present disclosure.

The capacitor $C_4$ corresponds to "fourth capacitor" in the present disclosure. A parallel-connected circuit including the transistor $CP_2$ and the capacitor $C_4$ corresponds to "second capacitance circuit" in the present disclosure.

The capacitor $C_1$ is electrically connected between the collector of the transistor $Q_1$ and the base of the transistor $Q_1$. That is, the capacitor $C_1$ is connected in parallel with the collector-base capacitance $C_{CB1}$ of the transistor $Q_1$. Hence, a total capacitance between the collector and the base of the transistor $Q_1$ is the sum of a capacitance of the capacitor $C_1$ and the collector-base capacitance $C_{CB1}$.

The collector-base capacitance $C_{CB1}$ of the transistor $Q_1$ is a nonlinear capacitance, whereas the capacitance of the capacitor $C_1$ is a linear capacitance. Hence, with respect to the total capacitance between the collector and the base of the transistor $Q_1$, nonlinearity is reduced, and linearity is increased.

From the point of view of reducing the nonlinearity of the total capacitance between the collector and the base of the transistor $Q_1$, the capacitance of the capacitor $C_1$ can be increased. Note that increasing the capacitance of the capacitor $C_1$ too much is likely to result in a reduction in frequency characteristics of the power amplifier circuit 2A, or the like. Hence, the capacitance of the capacitor $C_1$ can be increased as much as possible within a range in which a reduction in frequency characteristics of the power amplifier circuit 2A, or the like is allowable. Note that the present disclosure is not limited to this.

The capacitor $C_1$ is provided, and the capacitor $C_3$ is correspondingly electrically connected between the collector of the transistor $Q_2$ and the base of the transistor $Q_1$. That is, the capacitor $C_3$ is connected in parallel with the collector-base capacitance of the transistor $CP_1$. Hence, a total capacitance between the collector of the transistor $Q_2$ and the base of the transistor $Q_1$ is the sum of a capacitance of the capacitor $C_3$ and the collector-base capacitance of the transistor $CP_1$.

The collector-base capacitance of the transistor $CP_1$ is a nonlinear capacitance, whereas the capacitance of the capacitor $C_3$ is a linear capacitance. Hence, with respect to the total capacitance between the collector of the transistor $Q_2$ and the base of the transistor $Q_1$, nonlinearity is reduced, and linearity is increased.

The capacitance of the capacitor $C_3$ can be substantially equal to the capacitance of the capacitor $C_1$. Thus, the amount of decrease in voltage due to the negative feedback action of the total capacitance between the collector and the base of the transistor $Q_1$ is compensated for by the amount of increase in voltage due to the positive feedback action of the total capacitance between the collector of the transistor $Q_2$ and the base of the transistor $Q_1$. Note that the present disclosure is not limited to this.

Similarly, the capacitor $C_2$ is electrically connected between the collector of the transistor $Q_2$ and the base of the transistor $Q_2$. That is, the capacitor $C_2$ is connected in parallel with the collector-base capacitance $C_{CB2}$ of the transistor $Q_2$. Hence, a total capacitance between the collector and the base of the transistor $Q_2$ is the sum of a capacitance of the capacitor $C_2$ and the collector-base capacitance $C_{CB2}$.

The collector-base capacitance $C_{CB2}$ of the transistor $Q_2$ is a nonlinear capacitance, whereas the capacitance of the capacitor $C_2$ is a linear capacitance. Hence, with respect to the total capacitance between the collector and the base of the transistor $Q_2$, nonlinearity is reduced, and linearity is increased.

From the point of view of reducing the nonlinearity of the total capacitance between the collector and the base of the transistor $Q_2$, the capacitance of the capacitor $C_2$ can be increased. Note that increasing the capacitance of the capacitor $C_2$ too much is likely to result in a reduction in frequency characteristics of the power amplifier circuit 2A, or the like. Hence, the capacitance of the capacitor $C_2$ can be increased as much as possible within a range in which a reduction in frequency characteristics of the power amplifier circuit 2A, or the like is allowable. Note that the present disclosure is not limited to this.

The capacitor $C_2$ is provided, and the capacitor $C_4$ is correspondingly electrically connected between the collector of the transistor $Q_1$ and the base of the transistor $Q_2$. That is, the capacitor $C_4$ is connected in parallel with the collector-base capacitance of the transistor $CP_2$. Hence, a total capacitance between the collector of the transistor $Q_1$ and the base of the transistor $Q_2$ is the sum of a capacitance of the capacitor $C_4$ and the collector-base capacitance of the transistor $CP_2$.

The collector-base capacitance of the transistor $CP_2$ is a nonlinear capacitance, whereas the capacitance of the capacitor $C_4$ is a linear capacitance. Hence, with respect to the total capacitance between the collector of the transistor $Q_1$ and the base of the transistor $Q_2$, nonlinearity is reduced, and linearity is increased.

The capacitance of the capacitor $C_4$ can be substantially equal to the capacitance of the capacitor $C_2$. Thus, the amount of decrease in voltage due to the negative feedback action of the total capacitance between the collector and the base of the transistor $Q_2$ is compensated for by the amount of increase in voltage due to the positive feedback action of the total capacitance between the collector of the transistor $Q_1$ and the base of the transistor $Q_2$. Note that the present disclosure is not limited to this.

As described above, since the nonlinearity of the capacitance of each element is reduced and the linearity is increased, the power amplifier circuit 2A can perform amplification. Thus, the power amplifier circuit 2A can perform envelope tracking.

Third Embodiment

Figure 9:
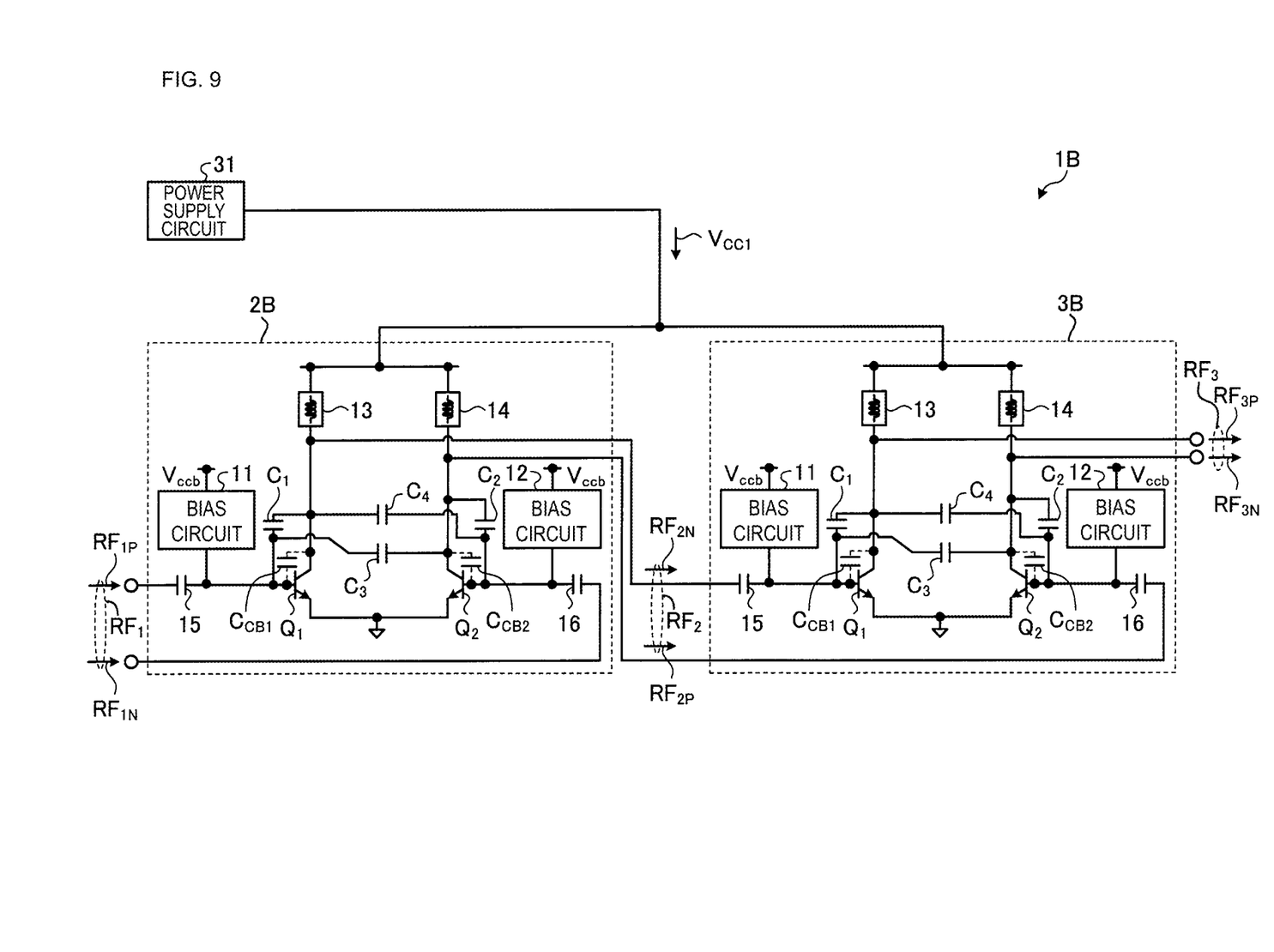
FIG. 9 illustrates a configuration of a power amplifier according to a third embodiment.

FIG. 9 illustrates a configuration of a power amplifier according to a third embodiment. A power amplifier 1B includes power amplifier circuits 2B and 3B. In comparison with the power amplifier circuit 2A, the power amplifier circuit 2B does not include the transistors $CP_1$ and $CP_2$. A circuit configuration of the power amplifier circuit 3B is similar to a circuit configuration of the power amplifier circuit 2B, and a description thereof is therefore omitted.

The capacitor $C_1$ corresponds to "first capacitor" in the present disclosure. The capacitor $C_2$ corresponds to "second capacitor" in the present disclosure. The capacitor $C_3$ corresponds to "third capacitor" and "first capacitance circuit" in the present disclosure. The capacitor $C_4$ corresponds to "fourth capacitor" and "second capacitance circuit" in the present disclosure.

It is also conceivable that, if the greater part of the amount of decrease in voltage due to the negative feedback action of the total capacitance between the collector and the base of the transistor $Q_1$ is compensated for by the amount of increase in voltage due to the positive feedback action of the total capacitance between the collector of the transistor $Q_2$ and the base of the transistor $Q_1$, complete compensation does not have to be achieved. From this point of view, the power amplifier circuit 2B does not include the transistor $CP_1$.

The capacitance of the capacitor $C_3$ can be equal to the total capacitance between the collector and the base of the transistor $Q_1$. However, the total capacitance between the collector and the base of the transistor $Q_1$ is nonlinear, whereas the capacitance of the capacitor $C_3$ is linear. Hence, the capacitance of the capacitor $C_3$ is not able to be made completely equal to the total capacitance between the collector and the base of the transistor $Q_1$. Thus, the capacitance of the capacitor $C_3$ can be approximately equal to the total capacitance between the collector and the base of the transistor $Q_1$ within a range in which a collector-base voltage of the transistor $Q_1$ varies. That is, the capacitance of the capacitor $C_3$ can be the sum of the capacitance of the capacitor $C_1$ and the collector-base capacitance $C_{CB1}$ of the transistor $Q_1$ within the range in which the collector-base voltage of the transistor $Q_1$ varies. Note that the present disclosure is not limited to this.

Similarly, it is also conceivable that, if the greater part of the amount of decrease in voltage due to the negative feedback action of the total capacitance between the collector and the base of the transistor $Q_2$ is compensated for by the amount of increase in voltage due to the positive feedback action of the total capacitance between the collector of the transistor $Q_1$ and the base of the transistor $Q_2$, complete compensation does not have to be achieved. From this point of view, the power amplifier circuit 2B does not include the transistor $CP_2$.

The capacitance of the capacitor $C_4$ ca be equal to the total capacitance between the collector and the base of the transistor $Q_2$. However, the total capacitance between the collector and the base of the transistor $Q_2$ is nonlinear, whereas the capacitance of the capacitor $C_4$ is linear. Hence, the capacitance of the capacitor $C_4$ is not able to be made completely equal to the total capacitance between the collector and the base of the transistor $Q_2$. Thus, the capacitance of the capacitor $C_4$ can be approximately equal to the total capacitance between the collector and the base of the transistor $Q_2$ within a range in which a collector-base voltage of the transistor $Q_2$ varies. That is, the capacitance of the capacitor $C_4$ can be the sum of the capacitance of the capacitor $C_2$ and the collector-base capacitance $C_{CB2}$ of the transistor $Q_2$ within the range in which the collector-base voltage of the transistor $Q_2$ varies. Note that the present disclosure is not limited to this.

As described above, in comparison with the power amplifier circuit 2A, the power amplifier circuit 2B can reduce the number of elements. Thus, in comparison with the power amplifier circuit 2A, the power amplifier circuit 2B enables a reduction in circuit size.

The above-described embodiments are intended to facilitate understanding of the present disclosure, but are not intended for a limited interpretation of the present disclosure. The present disclosure can be changed or improved without necessarily departing from the gist thereof and includes equivalents thereof.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit configured to amplify a first high-frequency differential signal that includes a first high-frequency signal of positive polarity and a second high-frequency signal of negative polarity, and to output a second high-frequency differential signal that includes a third high-frequency signal of negative polarity and a fourth high-frequency signal of positive polarity, the power amplifier circuit comprising:
   a first transistor having an emitter electrically connected to a common potential, a base to which the first high-frequency signal is input, and a collector from which the third high-frequency signal is output;
   a second transistor having an emitter electrically connected to the common potential, a base to which the second high-frequency signal is input, and a collector from which the fourth high-frequency signal is output;
   a first capacitance circuit electrically connected between the collector of the second transistor and the base of the first transistor; and
   a second capacitance circuit electrically connected between the collector of the first transistor and the base of the second transistor,
   wherein the first capacitance circuit comprises a third transistor having a collector electrically connected to the collector of the second transistor, a base electrically connected to the base of the first transistor, and an emitter electrically connected to the base of the third transistor, and wherein the second capacitance circuit comprises a fourth transistor having a collector electrically connected to the collector of the first transistor, a base electrically connected to the base of the second transistor, and an emitter electrically connected to the base of the fourth transistor.

2. The power amplifier circuit according to claim 1, further comprising:

a first capacitor electrically connected between the collector of the first transistor and the base of the first transistor; and a second capacitor electrically connected between the collector of the second transistor and the base of the second transistor, wherein the first capacitance circuit further comprises a third capacitor electrically connected between the collector of the second transistor and the base of the first transistor, and wherein the second capacitance circuit further comprises a fourth capacitor electrically connected between the collector of the first transistor and the base of the second transistor.

3. The power amplifier circuit according to claim 1, wherein a collector-base capacitance of the third transistor is equal to a collector-base capacitance of the first transistor, and wherein a collector-base capacitance of the fourth transistor is equal to a collector-base capacitance of the second transistor.

4. The power amplifier circuit according to claim 2, wherein a collector-base capacitance of the third transistor is equal to a collector-base capacitance of the first transistor, and wherein a collector-base capacitance of the fourth transistor is equal to a collector-base capacitance of the second transistor.

5. The power amplifier circuit according to claim 1, wherein a size of the third transistor is equal to a size of the first transistor, and wherein a size of the fourth transistor is equal to a size of the second transistor.

6. The power amplifier circuit according to claim 2, wherein a size of the third transistor is equal to a size of the first transistor, and wherein a size of the fourth transistor is equal to a size of the second transistor.

7. The power amplifier circuit according to claim 1, further comprising:

a first capacitor electrically connected between the collector of the first transistor and the base of the first transistor; and a second capacitor electrically connected between the collector of the second transistor and the base of the second transistor, wherein the first capacitance circuit comprises a third capacitor electrically connected between the collector of the second transistor and the base of the first transistor, and wherein the second capacitance circuit comprises a fourth capacitor electrically connected between the collector of the first transistor and the base of the second transistor.

8. The power amplifier circuit according to claim 2, wherein a capacitance of the third capacitor is equal to a capacitance of the first capacitor, and wherein a capacitance of the fourth capacitor is equal to a capacitance of the second capacitor.

9. The power amplifier circuit according to claim 5, wherein a capacitance of the third capacitor is equal to a capacitance of the first capacitor, and wherein a capacitance of the fourth capacitor is equal to a capacitance of the second capacitor.

10. A power amplifier circuit configured to amplify a first high-frequency differential signal that includes a first high-frequency signal of positive polarity and a second high-frequency signal of negative polarity, and to output a second high-frequency differential signal that includes a third high-frequency signal of negative polarity and a fourth high-frequency signal of positive polarity, the power amplifier circuit comprising:

a first transistor having an emitter electrically connected to a common potential, a base to which the first high-frequency signal is input, and a collector from which the third high-frequency signal is output;

a second transistor having an emitter electrically connected to the common potential, a base to which the second high-frequency signal is input, and a collector from which the fourth high-frequency signal is output;

a first capacitance circuit electrically connected between the collector of the second transistor and the base of the first transistor;

a second capacitance circuit electrically connected between the collector of the first transistor and the base of the second transistor;

a first capacitor electrically connected between the collector of the first transistor and the base of the first transistor; and a second capacitor electrically connected between the collector of the second transistor and the base of the second transistor, wherein the first capacitance circuit comprises a third capacitor electrically connected between the collector of the second transistor and the base of the first transistor, and wherein the second capacitance circuit comprises a fourth capacitor electrically connected between the collector of the first transistor and the base of the second transistor.

11. The power amplifier circuit according to claim 10, wherein the first capacitance circuit comprises a third transistor having a collector electrically connected to the collector of the second transistor and a base electrically connected to the base of the first transistor, and wherein the second capacitance circuit comprises a fourth transistor having a collector electrically connected to the collector of the first transistor and a base electrically connected to the base of the second transistor.

12. The power amplifier circuit according to claim 11, wherein a collector-base capacitance of the third transistor is equal to a collector-base capacitance of the first transistor, and wherein a collector-base capacitance of the fourth transistor is equal to a collector-base capacitance of the second transistor.

13. The power amplifier circuit according to claim 11, wherein a size of the third transistor is equal to a size of the first transistor, and wherein a size of the fourth transistor is equal to a size of the second transistor.

14. The power amplifier circuit according to claim 10,
wherein a capacitance of the third capacitor is equal to a
   capacitance of the first capacitor, and
wherein a capacitance of the fourth capacitor is equal to
   a capacitance of the second capacitor.

15. The power amplifier circuit according to claim 13,
wherein a capacitance of the third capacitor is equal to a
   capacitance of the first capacitor, and
wherein a capacitance of the fourth capacitor is equal to
   a capacitance of the second capacitor.

\* \* \* \* \*